METHOD FOR MAKING ELECTRICAL MONOGRAIN LAYER

Filed Aug. 1, 1966 2 Sheets-Sheet 1

METHOD FOR MAKING ELECTRICAL MONOGRAIN LAYER

Filed Aug. 1, 1966 2 Sheets-Sheet 2

United States Patent Office 3,764,325
Patented Oct. 9, 1973

3,764,325
METHOD FOR MAKING ELECTRICAL MONOGRAIN LAYER

Ties Siebolt te Velde, Emmasingel, Eindhoven, Netherlands, assignor to U.S. Philips Corporation, New York, N.Y.

Filed Aug. 1, 1966, Ser. No. 569,170
Claims priority, application Netherlands, Aug. 4, 1965, 6510096
The portion of the term of the patent subsequent to Oct. 9, 1988, has been disclaimed
Int. Cl. G03c *5/00, 11/00*
U.S. Cl. 96—38.4 11 Claims

ABSTRACT OF THE DISCLOSURE

A method of making an electrical monograin layer device in which the layer of grains, usually of semiconductive material, are embedded in a photoresist layer, which is then exposed through the grains and developed. The photoresist portions shadowed by the grains remain unexposed and are removed by the developer, whereas the resist portions extending between the grains and exposed become hardened and bind the grains together. The exposed grain surface portions are then contacted with an electrode.

Figure 1:
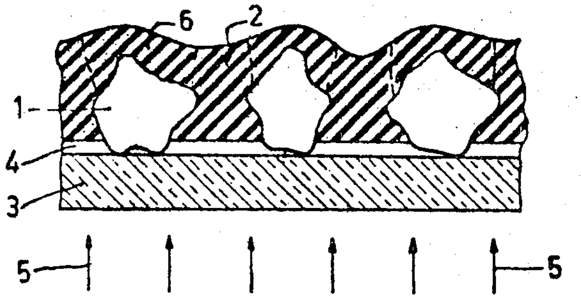
Figure 2:
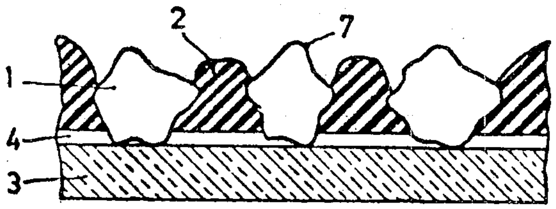

The invention relates to a method of manufacturing a sandwich-shaped electrical device comprising a layer of active grains provided between two electrodes, in particular a layer of semiconductive grains, having substantially the thickness of one grain. The layer of grains comprises at least over part of its thickness an electrically insulating filler in the spaces between the grains, with the electrode provided on at least one side of the layer of grains making contact with free surface portions of the grains.

Such electrical devices made up of photosensitive or photoconductive grains are useful as radiation detectors for corpuscular or electromagnetic radiation, for example, photo-diodes and photo-resistors. When radiation impinges upon such photosensitive layer of grains, an electromotive force or impedance difference is produced across the layer of grains, which can be detected by means of the electrodes provided on the layers, one of which will be permeable to the incident radiation. Such electrical devices are also useful for converting radiation energy into electric energy, for example, a solar cell. Another application is the conversion of electrical energy into radiation energy, for example, by recombination radiation in a junction of a semiconductor grain, or by electroluminescence.

In all these cases it is advantageous to use layers of grains which have a thickness of substantially only one grain, since in this case the contact resistances between the grains can be avoided and, in addition, no grains are present which are screened against radiation by other grains. Besides, in such case the material consumption per surface unit of the layer of grains is minimized.

In addition, electrical devices of the type described, constructed, for example, as capacitors or as diodes, employ grains which include a p-n junction. In such semiconductor diodes, the p-n junction will be located in a monocrystal and should have a minimum surface area which is determined by various factors. Some semiconductor materials cannot be obtained in the form of sufficiently large monocrystals or can be obtained as such with difficulty only, but they can be manufactured in a sufficiently pure form as powders consisting of monocrystalline grains. In such cases, instead of a relatively large monocrystal the layer of grains as described above will be used, in which the grains contain a p-n junction and in which the p-n junctions in the grains between the electrodes are connected in parallel and as a whole have the desired total surface area.

Thus, the problem to be solved is to provide a monograin layer, i.e., a layer of grains having the thickness of one grain, in which the grains are held together by a binder but which must be free from the binder at least on one side of the layer of grains and often on both sides in order to enable contact to be made thereto by the electrodes.

A known method is to form such layers of grains by embedding the grains entirely in a hardening filler which binds the grains, and grinding the layer of grains after hardening of the filler to a depth at which a layer of only one grain thickness remains, the grains thus being made accessible for contacting. Such a method may adversely influence the electric properties of the grains, especially semiconductive grains, as a result of the mechanical process applied thereto. In addition, such a method is difficult or impossible to perform when the grains have very small dimensions, for example, in the case of powders, in which case the grains may have diameters smaller than, for example, 50 microns.

The principal object of the invention is to avoid the disadvantages of the above-known methods, and is based on the recognition that the manufacture of such monograin electrical devices described can be realized in a simple manner using photoresist methods.

According to the invention, the grains, at least on a side where an electrode is to be provided, are embedded in a photoresist. The photoresist is hardened by means of exposure from the opposite side of the layer of grains using radiation chosen on the basis of the difference in permeability to said radiation of the grains and of the filler between the grains. As a result, the resist parts covering the grains remain soluble in an associated developer. After removal of the soluble parts of the photoresist by means of a developing process, the top surface parts of the grains are exposed and an electrode layer can then be provided in contact with the thus freed surface parts.

The term "photoresist" is to be understood to include the photochemical substances commonly used in photoresist methods, insofar as these have satisfactory electrically insulating properties at least for the application concerned. In this connection, one should bear in mind the difference between a negative photoresist which, by a photochemical process, is selectively made insoluble in a developer at the exposed places but is hardened and remains soluble in the developer at the non-exposed places, and a positive photoresist which, by a photochemical process, becomes soluble selectively at its exposed places and remains insoluble at the non-exposed places in an associated developer. Hardening of a photoresist layer is to be understood to mean herein the obtaining, by means of exposure to radiation, of a pattern of parts of the layer which are soluble and insoluble in a developer.

Although a method according to the invention may advantageously be used for the manufacture of electrical devices having grains which are homogeneous in composition, the method according to the invention is of particular importance for the manufacture of devices using grains containing regions of different properties and in which surface parts of the corresponding regions of the grains must be exposed and rendered accessible for contacting purposes. Thus, an important embodiment of the method according to the invention is characterized in that the grains contain a core and an enveloping layer having different conductivity properties, and the grains are embedded only over part of their thickness in the photoresist, while they are embedded over an adjacent part of their thickness in a further filler.

Before the photoresist is provided over part of the thickness of the grains, the enveloping layer is removed over a part of the thickness of the grains by etching, while by hardening and developing the photoresist, the surface parts belonging to the core of the grains are freed from the photoresist.

By means of this embodiment of the method according to the invention, it has proved possible in a simple manner to provide an electrode layer only in contact with the core of the grains, while avoiding the simultaneous contacting of the enveloping layer of the grains. To contact the enveloping layer, a second electrode layer is provided.

The core and the enveloping layer may consist of quite different materials, for example, different semiconductor materials, or differ only in doping. Of particular importance is, for example, the use of semiconductor grains with an enveloping layer which forms a p-n junction with the core. In this case, according to the method described, an electrode is provided which makes contact only with the core material. If subsequently a second electrode is provided on the other side of the layer of grains, by methods to be described hereinafter, which makes contact only with the enveloping layer of the grains, the p-n junctions of all the grains between the two electrodes are connected in parallel. In this manner, for example, diodes, solar batteries or variable capacitors can be manufactured.

Also of importance is in addition the use of semiconductor grains with an enveloping layer which is of the same conductivity type as the core but has a lower resistivity than the core. Such an enveloping layer affords a substantially ohmic contact with the core material, which may be of importance for many applications.

The electrode layer may make a rectifying contact with the free surface parts of the grains. Such a contact may be used, for example, when biased in the forward direction, to obtain injection luminescence in grains suitable for that purpose. Alternatively, an electrode layer may be provided which makes a substantially ohmic contact with the free surface parts of the grains, for example, in the manufacture of photoresistors.

The electrode which is provided in contact with the free surface parts of the grains need not extend over the whole surface of the layer of grains but may consist of two spaced parts arranged besides one another with the layer of grains inbetween as a radiation-sensitive impedance. However, in many cases, it will be desirable for completing the electrode system to provide the other side of the layer of grains with a second electrode layer which makes similar contact with the grains. In connection herewith it is to be preferred, before applying the photoresist, to provide the grains on a radiation-permeable support by means of a radiation-permeable adhering layer, having a thickness smaller than the average thickness of the grains, in which the grains are sunk or embedded. Radiation-permeable is to be understood to mean herein substantially permeable to the radiation by which the photoresist used can be hardened and/or to radiation lying within the wavelength range in which the grains used are photosensitive or can emit radiation.

To obtain a regular layer of grains, preferably an adhesive layer is provided having a thickness smaller than half and preferably smaller than one fifth of the average grain thickness. Although it is possible in the methods to be described hereinafter to use a viscous adhesive layer which does not harden during the subsequent treatment, it recommended, also in connection with the filler to be provided on the adhesive layer afterwards, that a liquid or viscous adhesive layer is provided of a hardenable material, and that the said adhesive layer is hardened after sinking the grains.

The second electrode layer can be provided in various manners. In a particular simple manner, the second electrode layer can be obtained by using a radiation permeable support on which a radiation-permeable electrically conductive electrode layer is provided, the grains being sunk in the adhesive layer until they contact the radiation-permeable electrode layer. The exposure of the photoresist to be applied may be effected through the support and the permeable electrode layer. Materials of a varying nature can be used as the adhesive layer. It may be advantageous that an adhesive layer likewise consisting of a photoresist is provided. In the latter case, the adhesive layer is provided on the support in the required thickness, and then is entirely hardened after providing the grains. However, it is alternatively possible to provide a thicker adhesive layer consisting of a negative photoresist which, after sinking the grains, is exposed to radiation of such a wavelength and intensity and for such a period of time through the support that the adhesive layer is hardened only over part of its thickness, which part is smaller than the average grain thickness, after which the non-hardened photoresist with those grains which are located in it entirely are removed by a developing process. The advantage of this method is that in this case the thickness of the originally provided photoresist layer is not critical. In the method described, an electrical device is ultimately obtained having a layer of grains on a support.

It has been found, however, that in certain conditions it may be difficult to effect in this manner a satisfactory electric contact between the grains and the electrode layer provided on the support. In that case, another method of contacting the layer of grains with a second electrode layer on the side of the support may advantageously be used. In this case an adhesive layer is used which consists of a material which, after providing the photoresist and the electrode layer, can be dissolved selectively in a solvent. After providing the electrode layer, the layer of grains is removed from the support by selectively dissolving the adhesive layer, after which a second electrode layer is provided on the obtained free surface of the grains. In this manner, a self-supporting electrode system is obtained, which may be used in devices such as solar batteries, photodiodes, electroluminescent panels, and variable capacitances having a p-n junction, and which afterwards may be provided on a support if so required, for example, to increase its rigidity. In the method described here in which the layer of grains is removed from the support after providing the first electrode layer, it is recommended in general that, before removing the layer of grains from the support, a preferably flexible layer of a hardening synthetic material is provided on the electrode layer, and that after hardening of the synthetic material the layer of grains is removed from the support. In this manner a rigid self-supporting layer is obtained, which can better withstand damages.

In order that the invention may readily be carried into effect, a few embodiments thereof by way of example will now be described in greater detail with reference to the accompanying drawings, in which: FIGS. 1 to 5 are diagrammatic cross-sectional views of a part of a solar battery manufactured by using the method according to the invention in successive stages of manufacture; FIGS. 6 to 9 diagrammatically show cross-sectional views of another solar battery in successive stages of manufacture.

With reference to FIGS. 1 to 5, a first embodiment will be described of a method according to the invention of manufacturing an electrode system comprising a monograin layer of grains 1 (FIG. 5) of a semiconductor material, and an electrically insulating filler 2 between the grains 1. On one side of the layer of grains an electrode layer 8 is provided which makes contact with surface parts 7 of the grains 1.

According to the invention, the grains 1 are embedded, at least on the side where the electrode layer 8 will be provided, in a photoresist 2. See FIG. 1. In the present example, this is a negative photoresist. By means of exposure to radiation in the direction of the arrows 5, the photoresist 2 is then hardened. The intensity, wavelength and duration of exposure, in relation to the permeability of the grains 1 and the photoresist 2, are chosen to be such that the irradiated photoresist 2 parts between the grains 1 are hardened, whereas due to radiation absorption in the grains 1, the parts 6 of the photoresist 2 which lie at least over the grains 1 remain soluble in an associated developer. Afterwards, by means of a developing process, the soluble parts 6 of the photoresist 2 are removed exposing free surface parts 7 of the grains 1 (see FIG. 2), after which the electrode layer 8 (see FIG. 3) can be provided in contact with the exposed surface parts 7.

In the example to be described here, the grains 1 are formed into a coherent layer before the photoresist 2 is provided, and this is done by providing the grains 1 on a support 3 by means of an adhesive layer 4 having a thickness smaller than the average thickness of the grains, in which layer the grains 1 are sunk. In this example, the support 3 and the adhesive layer 4 are permeable to radiation, so that the photoresist 2 can be hardened. The electrode system to be manufactured will be a solar battery.

The method is carried out, for example, as follows: On a radiation-permeable support 3, for example, of glass (see FIG. 1), an adhesive layer 4 consisting, for example, of gelatin is provided. This may be effected by dipping the support 3 in a solution of, for example, 15% gelatin in water at a temperature of approximately 40° C. When the support 3 is drawn out of the solution, a gelatin layer 4 having a thickness of a few microns remains on the support. Semiconductor grains 1 consisting of cadmium sulphide activated with approximately $10^{-4}\%$ by weight of copper, and a substantially equal percentage of gallium or halogens, and having an average grain diameter of approximately 30 microns, are sunk or embedded in said adhesive layer 4. Although adhesive layers of different thicknesses may be used, it has been found in practice that the use of thin adhesive layers having a thickness smaller than half and preferably smaller than one-fifth of the average thickness of the grains promotes the obtention of an even layer of grains. For that purpose, in the present example, a gelatin layer 4 of only a few microns, e.g. 2–4$\mu$, thickness is used.

The gelatin layer 4 is then hardened by drying after which the grains not adhered to the support 3 are removed, for example, by shaking or blowing air thereon.

The grains 1 adhered to the support 3 in this manner are then further embedded in a layer 2 of a photoresist, for example, Kodak Photo Resist (KPR). The layer is made thick enough to cover the grains 1. Through the support 3 the photoresist layer 2 is then exposed in the direction of the arrows 5 to radiation, for example, from a high pressure mercury lamp which is arranged at a distance of approximately 20 cm. from the support. In this case, the permeability of the photoresist 2 to the radiation used is very much larger than that of the cadmium sulphide grains. The duration and intensity of the radiation can be chosen in a simple manner by those skilled in the art in such manner that the photoresist layer 2 is hardened throughout its thickness, except for regions 6 which cover the grains and are not exposed, which thus remain soluble while the rest of the photoresist 2 becomes insoluble in the associated developer.

The photoresist regions 6 (see FIG. 2) are then removed by means of the known developing process while the photoresist 2 remains between the grains as a binder exposing the surface parts 7.

Figure 3:
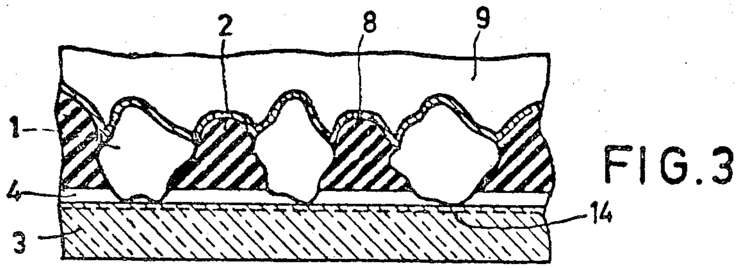
Figure 4:
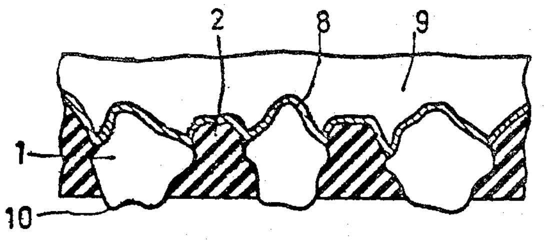

On the side of the layer of grains remote from the support and on the free surface parts 7 is then provided, for example, by vapor deposition, a radiation-permeable electrode layer 8 of copper of approximately 100 A. thickness (see FIG. 3). This electrode layer 8 forms a rectifying contact with the cadmium sulphite grains 1. In addition, a second electrode layer must be provided on the side of the layer of grains opposite to the electrode layer 8. The second electrode layer can be obtained in a simple manner by using a radiation-permeable support 3 which was previously covered on the side of the layer of grains with a transparent electrode layer of, for example, indium oxide, denoted in FIG. 3 by the broken line 14, which touches the grains 1 sunk in the adhesive layer 4.

Figure 5:
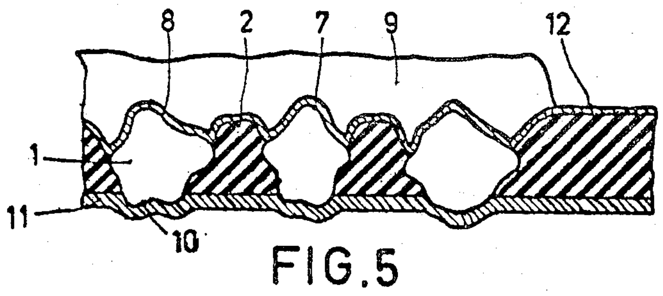
Figure 6:
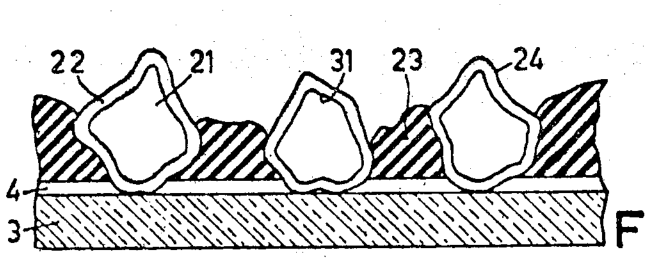
Figure 7:
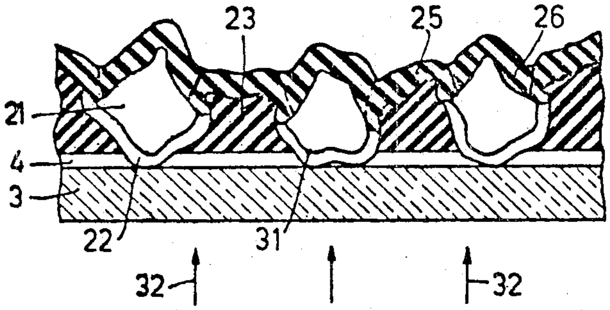
Figure 8:
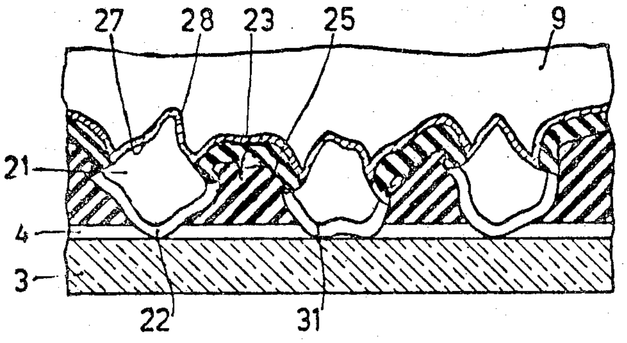
Figure 9:
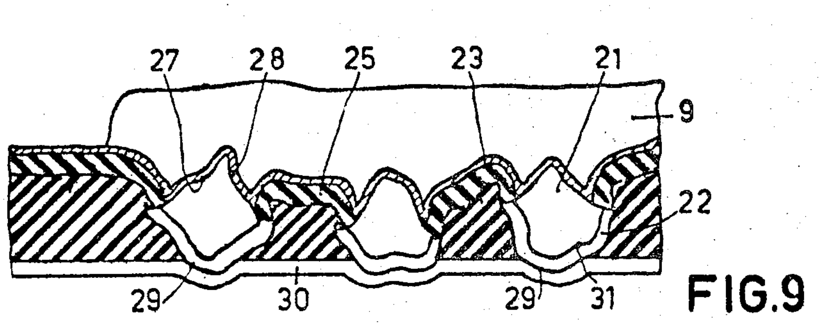

However, it is sometimes difficult in this manner to obtain a satisfactory ohmic contact so that it is preferred in accordance with the invention to use an adhesive layer 4 which consists of a material which can be dissolved selectively in a solvent after providing the photoresist 2 and the electrode layer 8. Thus, the layer of grains is removed from the support by selective dissolution of the adhesive layer 4, after which a second electrode layer 11 (see FIG. 5) is provided on the free surface parts 10 (see FIG. 4) of the grains 1. This is described and claimed in my copending application, Ser. No. 569,248, filed Aug. 1, 1966, the contents of which are hereby incorporated by reference. For example, when gelatin is used, which is water soluble, by dipping in water the adhesive layer 4 is dissolved and the layer of grains can be separated from the support 3. Free surface parts 10 (FIG. 4) are obtained. Then an electrode layer 11 is provided, for example, by vapor deposition of a layer of indium, 0.3 micron thick, as shown in FIG. 5. This electrode layer 11 makes a substantially ohmic contact with the cadmium sulphide. As a result, a solar battery is obtained, in which radiation which is incident through the permeable electrode layer 8 on the grains 1 produces a voltage difference between the electrode layers 8 and 11.

It is to be noted that when using adhesive layers which have strong adherence to the support 3, as is the case with gelatin and glass, the support 3 may advantageously be covered previously with a layer of a substance which decreases that adherence. For example, before providing the gelatin layer 4, the glass support 3 may be covered with a layer of nitrocellulose, a few microns thick, by dipping in a solution of 10% nitrocellulose in butyl acetate. Since the adherence of gelatin to nitrocellulose is less strong than to glass, the gelatin layer 4 can thus be removed more easily afterwards.

When recoving the layer of grains (1,2) from the support 3, the problem may present itself that as a result of its small thickness, the layer of grains is vulnerable and cannot readily be handled.

Therefore, to strengthen the layer of grains (see FIG. 3), a preferably flexible radiation permeable layer 9 is provided on the electrode layer 8 before removing the adhesive layer 4. The layer 9 may consist, for instance, of an epoxy resin, methyl methacrylate, or the like. After hardening of the layer 9, the layer of grains is removed from the support 3. The thickness of the layer 9 is not critical. In this example, a layer 9 consisting of a radiation-permeable epoxy resin is provided having a thickness of approximately 100 microns, in which (see FIG. 5) a surface part 12 of the layer of grains is kept free from the layer 9 to enable contacting of the electrode layer 8.

The adhesive layer 4 which in this embodiment consists of gelatin may consist of many other materials which are soluble in water or other liquids. For example, aqueous solutions of saccarese and glucose or polyvinyl alcohol may be used, and also non-aqueous solutions, for example of nitrocellulose acetate in butanone, and so on. It may further be of advantage to provide an adhesive layer which also consists of a photoresist. Alternatively, the adhesive layer 4 may be of a material which can easily be removed by volatilization. The radiation-permeable support 3, which in this example consists of glass, may, of course, also consist of other radiation-permeable materials, for example Lucite, and so on.

With reference to FIGS. 6 to 9, an example of a method according to the invention will now be described in which grains 21, 22 are used consisting of a core 21 and an enveloping layer 22 having different conductivity properties and in which the grains 21, 22 are embedded only over part of their thickness in a photoresist 25, 26 while the grains are already embedded in a further filler 23 over an adjacent part of their thickness. See, in particular FIG. 7. In this example, before the photoresist 25, 26 is provided over part of the thickness of the grains 21, 22, the enveloping layer 22 is removed by etching over said part of the thickness of the grains 21, 22 (see FIGS. 6 and 7) while, by hardening and developing the photoresist 25, 26, only surface parts 27 (see FIG. 8) belonging to the core 21 of the grains 21, 22 are exposed on which subsequently an electrode layer 28 can be provided in contact with the said surface parts 27.

This second example will likewise relate to a solar battery but of a different structure. The starting point is a layer of grains provided on a transparent, for example, glass, support 3, by means of an adhesive layer 4, which layer of grains consists of grains 21, 22 embedded in a filler 23, for example, a negative photoresist, such as Kodak Photo Resist (KPR), in which surface parts 24 of the grains 21, 22 are free from the photoresist 23. The layer of grains shown in FIG. 6 which is provided on a support can be manufactured in the same manner as that shown in FIG. 2, and also correspond to the latter as regards dimensions and size of the grains. The only difference is that the grains 21, 22 (see FIG. 6) consist of a core 21 of n-type material, for example, n-type cadmium telluride, and an enveloping layer 22 of p-type cadmium telluride, separated by a p-n junction 31. The p-type conductive enveloping layer 22 is obtained, for example, in a manner normally used in semiconductor technology, by in-diffusion of phosphorus, and has a thickness of approximately 1 micron.

The free surface parts 24 of the grains 21, 22 (see FIG. 6) are then etched away with, for example, a 50% KOH-solution, until the layer 22 has disappeared at the exposed region of the grains and the cores 21 are exposed. On the side with the etched grains, the layer 25, 26 of Kodak Photo Resist is provided, thickness approximately 5 microns. By exposure through the support 3 of said photoresist layer 25, 26 in the direction of the arrows 32 (FIG. 7), the layer 25, 26 is hardened as a result of which, due to radiation absorption in the grains 21, 22, the parts 27 of the photoresist layer on the grains remain soluble in the associated developer whereas the parts 25 become insoluble. The radiation intensity may be chosen to be so strong and the duration of exposure so long that the photoresist parts 25 which have become insoluble extend to somewhat beyond the shadow of the grain as a result of diffraction phenomena and consequently cover the p-n junctions 31 appearing at the surface. By a developing process, the parts 26 of the photoresist layer 25, 26 are then removed in which only surface parts 27 (see FIG. 8) belonging to the core 21 of the grains 21, 22 are exposed. Then an electrode layer 28 consisting, for example, of indium, thickness approximately 0.3 micron, is provided on the free surface parts 27 (see FIG. 8) for example, by vapor deposition. The indium layer 28 substantially forms an ohmic contact on the n-type cadmium telluride 21. A layer 9 of an epoxy resin thickness approximately 200 microns, is then provided on the electrode layer 28, a part of the electrode layer 28 being uncovered to enable contacting (FIG. 9); after hardening the epoxy layer, the layer of grains is detached from the support 3 by dissolving the gelatin layer 4 in water. As a result of this, surface parts 29 on the side of the support belonging to the enveloping p-type layer 22 are exposed. A radiation permeable electrode layer 30 is then provided, for example, by vapor deposition, on the free surface parts 29. The electrode layer 30 may consist, for example, of a layer of gold, 100 A. thick. Like the electrode layer 28, the electrode layer 30 makes a substantially ohmic contact with the free surface parts of the grains. Thus a solar battery is obtained in which radiation which is incident though the permeable electrode layer 30 produces a voltage difference across the p-n junctions 31, located just above the electrode layer 30, which voltage difference can be measured at the electrodes 28 and 30.

Such an electrical device comprising a layer of grains with p-n junctions in the grains may also be used as a source of radiation by biasing the p-n junction 31 in the forward direction producing injection recombination radiation which can emerge through the permeable electrode layer 30. Alternatively, grains 21, 22 may be used as a starting material in which the enveloping layer is of the same conductivity type as the core 21, but has a lower resistivity than the core 21. Such an enveloping layer is well suited for forming an ohmic contact between the electrode layer 30 and the core material 21. In this case an electrode layer 28 may be used which makes a rectifying contact with the free surface parts 27 of the grains belonging to the core 21, and an electrode 30 which makes a substantially ohmic contact with the enveloping layer 22. When using this electrode device as a source of radiation, radiation can emerge through the radiation-permeable layer 28 and the synthetic material layer 29 (which in this case is also permeable to radiation), when the rectifying contact (21, 28) is biased in the forward direction.

It will be clear that the invention is not restricted to the examples described, but that a great number of variations and applications are possible within the scope of the invention. For example, the two electrode layers may be arranged beside one another on the same side of the layer of grains, but separated from one another by a region of the layer of grains which is not covered by electrode layers, for example, as in a photoresistor. The radiation-permeable electrode layer may be provided, instead of on the side described in the examples, on the opposite side of the layer of grains. Also the two electrode layers may pass radiation or may be impermeable to radiation. Nor is it necessary that the electrode layers join the filler everywhere. For example, a metal foil stretched over the grains may also be used as the electrode layer, intermediate spaces being present between the binder and the electrode layer. Furthermore, the layer of grains need not be flat, but may also be curved, for example, cylindrical.

While in the examples described, the electrodes or current supply means are shown as metal contacts, there may be constructions wherein one or both is replaced by a flow of charged particles, such as ions or electrons, which are impinged on the surfaces of the grains to effect a current supply or charge transport thereto; hence the term "electrode" as used herein should be accorded a meaning commensurate with the function required to be carried out by the electrodes.

It will further be evident that the invention is not limited to the specific active materials recited in the several examples described above. In general, all semiconductive materials, whether monocrystalline or polycrystalline, which are available in granular form, i.e., in small pieces or particles, for example, crystallites, and exhibit a property sensitive to radiation or which generate radiation are suitable for use in the device of the invention. Such materials include, for example, silicon, cadmium telluride, zinc selenide and others well known to those skilled in this art. As is evident, the method of the invention is concerned with the technique for producing the device and the choice of active materials and electrode materials is not critical within the broad scope of my teachings, though certain combinations of materials are preferred because of the superior results obtained. Nor for that matter are the deposition techniques for the various electrode materials critical. While the layer thicknesses given are merely illustrative and should not be considered as limiting the scope of my invention, the problem to which the invention is directed becomes particularly acute with active grains having diameters smaller than 50 microns, and thus my invention is particularly important in the manufacture of monograin layers using such tiny active grains.

Reference is also made to my copending application, Ser. No. 569,204, filed Aug. 1, 1966, for a description of a technique for improving the electrical contact of the radiation permeable electrode to the active grains without unduly attenuating the radiation incident on or emerging from the grains.

While I have described my invention in connection with specific embodiments and applications, other modifications thereof will be readily apparent to those skilled in this art without departing from the spirit and scope of the invention as defined in the appended claims.

What is claimed is:

1. A method of making an electrical device comprising plural electrode means and in contact therewith a layer of electrically active grains, comprising the steps of providing upon a transparent substrate a layer of electrically active grains having spaces therebetween, said layer having substantially the thickness of one grain, applying over the layer of grains and in the spaces between the grains a layer of a radiation-hardenable photoresist covering the grains to embed the grains therein, irradiating the photoresist from the opposite side of the layer and thus through the grains with radiation capable of exposing and hardening the photoresist portions between the grains and rendering same insoluble in a developer but substantially incapable of penetrating the grains leaving the resist portions over the grains substantially unexposed and thus soluble in a developer, developing the photoresist to dissolve and remove the soluble portions over the grains thereby exposing the top surface portions of the grains while leaving in place the insoluble resist portions binding the grains together, and providing electrode means to effect electrical charge transport to exposed surface portions of the grains.

2. A method as set forth in claim 1 wherein the grains are of semiconductive material, and the electrode makes one of a rectifying and ohmic contact to the exposed surface portions of the grains.

3. A method as set forth in claim 1 wherein the layer of grains is formed by applying to a radiation-permeable substrate an adhesive layer having a thickness smaller than the average thickness of the grains, then applying the grains to the adhesive layer to embed the grains therein to form a layer substantially one grain thick, and then removing the excess grains.

4. A method as set forth in claim 3 wherein the grains are less than 50 microns in diameter, and the adhesive layer is smaller than one-half the average grain diameter.

5. A method as set forth in claim 3 wherein the adhesive is of a liquid or viscous hardenable material, and after the monograin layer is formed, the adhesive is hardened.

6. A method as set forth in claim 3 wherein the substrate contains an electrically conductive surface, and the grains are embedded in such manner that they contact the electrically conductive surface.

7. A method as set forth in claim 6 wherein the adhesive layer is a photoresist.

8. A method as set forth in claim 3 wherein the adhesive layer is soluble, and after the electrode is contacted to the top surfaces of the grains, the adhesive layer is subjected to a solvent and the layer of grains separated from the substrate, and thereafter a second electrode is contacted to the bottom surface portions of the grains.

9. A method as set forth in claim 8 wherein, before separating the layer of grains from the substrate, a resilient, strengthening, radiation permeable synthetic resin material is provided over the top electrode.

10. A method of making an electrical device comprising a pair of electrodes and between the electrodes and in contact therewith a layer of semiconductive grains containing a junction between parts of different conductivity, comprising the steps of providing a layer of grains and covering the grains to partially embed them in an insulating filler. said layer having substantially the thickness of one grain and each grain comprising a core portion and an enveloping layer portion of different conductivity, etching the exposed portions of the grains to remove the enveloping layers and expose the core portions, applying over the layer of grains a layer of radiation-hardenable photoresist, irradiating the photoresist from the opposite side of the layer and thus through the grains with radiation capable of exposing and hardening the photoresist and rendering same insoluble in a developer but substantially incapable of penetrating the grains leaving the resist portions over the grains unexposed and thus soluble in a developer, developing the photoresist to dissolve and remove the soluble portions over the grains thereby exposing the core portions of the grains, providing an electrode in contact with the exposed core portions of the grains, and contacting the enveloping layer portions of the grains.

11. A method as set forth in claim 10 wherein the enveloping layer of the grain form p-n junctions with the grains' core portions.

References Cited

UNITED STATES PATENTS 2,842,463 3/1958 Bond et al. ........... 117—211

OTHER REFERENCES

Vacuum Deposition of Thin Films, Holland, John Wiley & Sons, Inc., 1956, pp. 206–7.

GEORGE F. LESMES, Primary Examiner

M. B. WITTENBERG, Assistant Examiner

U.S. Cl. X.R.

29—578, 579; 96—38.2, 44; 117—210; 136—89; 313—231